United States Patent [19]
Gentry et al.

[11] Patent Number: 5,399,107
[45] Date of Patent: Mar. 21, 1995

[54] MODULAR JACK WITH ENHANCED CROSSTALK PERFORMANCE

[75] Inventors: John M. Gentry, Candler, N.C.; Rahim Assayesh, Englewood, Colo.

[73] Assignee: Hubbell Incorporated, Orange, Conn.

[21] Appl. No.: 236,141

[22] Filed: May 2, 1994

Related U.S. Application Data

[63] Continuation of Ser. No. 110,829, Aug. 24, 1993, abandoned, which is a continuation of Ser. No. 4,409, Jan. 15, 1993, abandoned, and a continuation-in-part of Ser. No. 932,194, Aug. 20, 1992.

[51] Int. Cl.⁶ ............................................. H01R 23/02
[52] U.S. Cl. ......................................... 439/676; 439/76
[58] Field of Search .................. 439/76, 78, 571, 660, 439/676, 682, 698, 701, 894

[56] References Cited

U.S. PATENT DOCUMENTS

| | | | |
|---|---|---|---|
| 2,943,272 | 6/1960 | Feldman | 333/12 |
| 3,496,555 | 2/1970 | Jones | 340/174 |
| 3,757,028 | 9/1973 | Schessel | 174/33 |
| 3,891,815 | 6/1975 | Hiele | 335/152 |
| 4,221,458 | 9/1980 | Hughes et al. | |
| 4,367,908 | 1/1983 | Johnston | 439/676 |
| 4,413,469 | 11/1983 | Paguin | 57/273 |
| 4,481,379 | 11/1984 | Bolick | 174/117 |
| 4,556,264 | 12/1985 | Tanaka | |
| 4,689,441 | 8/1987 | Dick | 174/68.5 |
| 4,767,355 | 8/1988 | Phillipson et al. | 439/425 |
| 4,831,497 | 5/1989 | Webster | 361/406 |
| 4,850,887 | 7/1989 | Sugawara | 439/108 |
| 4,863,393 | 9/1989 | Ward et al. | 439/188 |
| 4,932,892 | 6/1990 | Hatch | 439/395 |
| 5,037,320 | 8/1991 | Stolte | 439/188 |
| 5,039,824 | 8/1991 | Takashima | 174/33 |
| 5,061,209 | 10/1991 | Bolick, Jr. et al. | 439/676 |
| 5,096,441 | 3/1992 | Jaag | 439/676 |
| 5,145,401 | 9/1992 | Archer | 439/395 |
| 5,186,647 | 2/1993 | Denkmann | 437/395 |
| 5,194,014 | 3/1993 | McClune et al. | 439/404 |
| 5,226,835 | 7/1993 | Baker, III et al. | 439/403 |
| 5,244,412 | 12/1991 | Hatch et al. | 439/567 |
| 5,269,708 | 12/1993 | DeYoung | 439/676 |

*Primary Examiner*—Khiem Nguyen
*Attorney, Agent, or Firm*—Jerry M. Presson; Mark S. Bicks

[57] ABSTRACT

The electrical connector includes a housing of dielectric material with a plurality of side walls and a plug receiving cavity opening on one side of the housing. First and second guides are integrally formed on an inner surface of one side wall and extend into the plug receiving cavity. The second guides project from the inner surface for a distance less than that of the first guides. The first and second guides alternate along the side wall. First and second contacts are received in the first and second guides. Each contact has a generally straight support leg engaged in the respective guide, an arcuately bent portion extending from the support leg and a free end portion extending from the bent portion into the plug receiving cavity. The support legs of the first and second contacts are located in the first and second parallel and spaced planes.

25 Claims, 3 Drawing Sheets

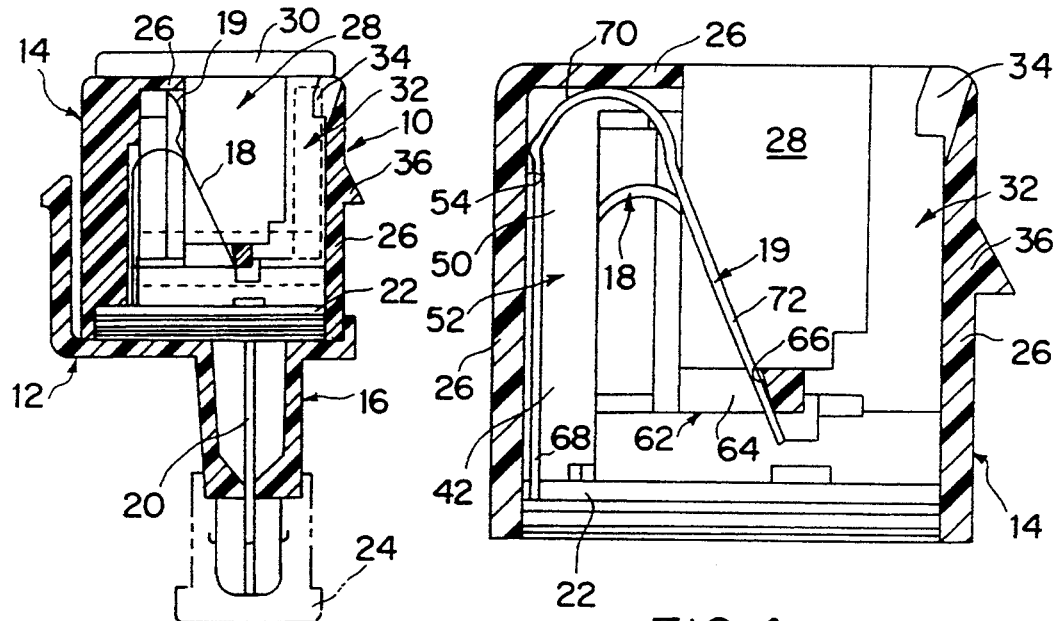
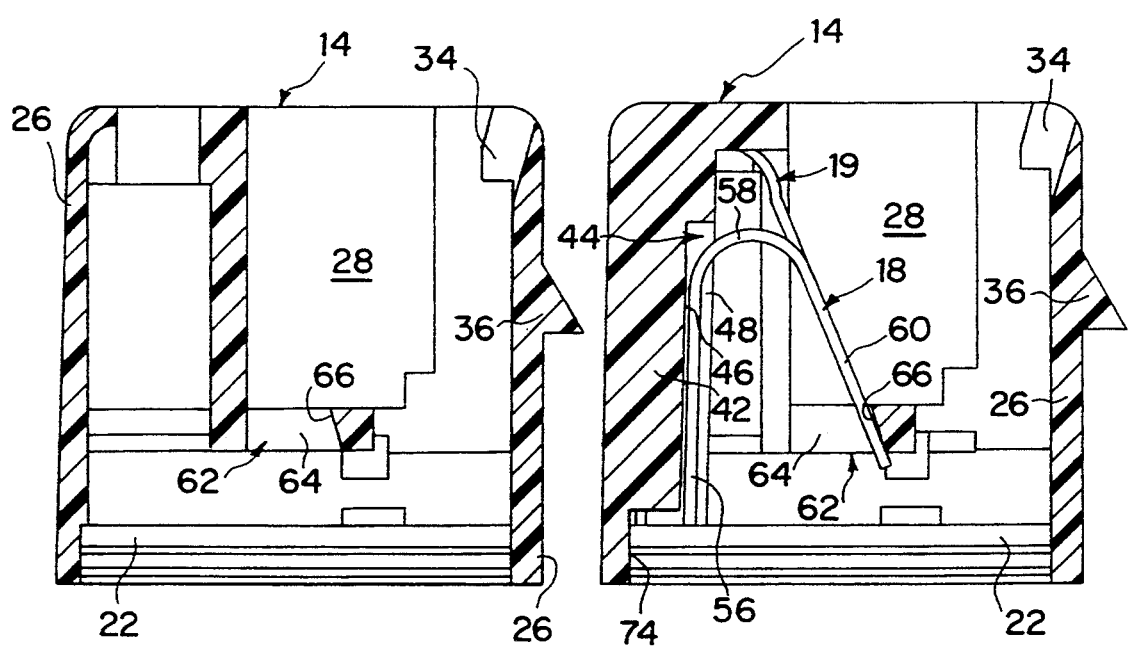

MODULAR JACK WITH ENHANCED CROSSTALK PERFORMANCE

REFERENCE TO RELATED APPLICATIONS

This is a continuation of application Ser. No. 08/110,829, filed Aug. 24, 1993, now abandoned; which is a continuation of U.S. patent application Ser. No. 08/004,409, filed Jan. 15, 1993, now abandoned, in the name of John M. Gentry and entitled Modular Jack with Enhanced Crosstalk Performance; is a continuation-in part of U.S. patent application Ser. No. 07/932,194, filed on Aug. 20, 1992 in the name of Daniel E. Klas and William J. Rose and entitled Connector for Communication Systems with Cancelled Crosstalk; and is related to U.S. patent application Ser. No. 08/002,871 filed concurrently herewith in the name of William J. Rose and Robert Aekins and entitled Telecommunication Connector with Feedback. The subject matter of each of the latter two applications is incorporated herein by reference.

FIELD OF THE INVENTION

The present invention relates to an electrical connector or modular jack for coupling a modular plug to a plurality of conductors. More particularly, the present invention relates to a modular housing in which portions of adjacent spring contacts are separated and supported by the dielectric material of the housing to reduce crosstalk across the signal paths provided by the contacts.

BACKGROUND OF THE INVENTION

Electrical connectors or modular jacks for telecommunications and data transmission system connectors are disclosed in U.S. Pat. No. 4,648,678 to Archer and U.S. Pat. No. 5,061,209 to Bolick. However, such connectors have limited performance capabilities, particularly for high performance data transmission at higher frequencies, i.e., greater than 1 MHz. Performance characteristics, particularly near end crosstalk, degrades at these higher frequencies.

When an electrical signal is carried on a signal line which is in close proximity to another signal line or lines, particularly adjacent contacts in a connector, energy from one signal line can be coupled onto adjacent signal lines by means of the electric field generated by the potential between two signal lines and the magnetic field generated as a result of the changing electric fields. This coupling, whether capacitive or inductive, is called crosstalk when this phenomenon occurs between two or more signal lines.

Crosstalk is a noise signal and degrades the signal-to-noise margin (S/N) of a system. In communications systems, reduced S/N margins result in greater error rates in the information conveyed on a signal line.

One way to overcome this crosstalk problem is to increase the spacing or the shielding between the signal lines. However, in many cases, the contact geometries are defined by standards for interchangeability with mating connectors, making changes in the connector contact geometries unavailable. The connector standards have existed prior to the need for high speed data communications.

These standards have created a large installed base of installed connectors and a need for connectors capable of meeting the requirements of today's high speed communications, while maintaining compatibility with existing connectors. Conventional connectors experience a great deal of crosstalk at the higher signal frequencies.

SUMMARY OF THE INVENTION

An object of the present invention is to provide an electrical connector for communication and data transmission systems which will effectively enhance performance by reducing crosstalk.

Another object of the present invention is to provide an electrical connector satisfying connector geometry standards and having enhanced performance characteristics which is simple to manufacture and use.

The foregoing objects are basically obtained by an electrical connector comprising a plurality of side walls and first and second guide means integrally formed on an inner surface of one of the side walls and projecting into a plug receiving cavity opening on one side of the housing. The second guide means projects from the inner surface for a distance less than that of the first guide means. The first and second guide means alternate along the one side wall. First and second contacts are received in said first and second guide means, respectively. The contacts have generally straight support legs engaged in the guide means, arcuately bent portions extending from the support legs and free end portions extending from the bent portions into the plug receiving cavity. The support legs of the first and second contacts are located in first and second parallel and spaced planes, respectively.

By forming the connector in this manner, the performance characteristics of the electrical connector are enhanced by reduction of crosstalk. The crosstalk is reduced by providing greater separation between the signal paths formed by the contacts. The greater separation is accomplished by staggering and offsetting the support legs of adjacent contacts in spaced, parallel planes and by making the contacts shorter and thinner. The use of shorter and thinner contacts is facilitated by the support of the contacts by the guide means. Additionally, the separation is increased by use of the guide means integral with the housing to provide greater dielectric material between adjacent contacts. These enhanced performance characteristics are provided in the connector, while maintaining compliance with the existing standards for connector geometry.

Other objects, advantages and salient features of the present invention will become apparent from the following detailed description, which, taken in conjunction with the annexed drawing discloses a preferred embodiment of the present invention.

BRIEF DESCRIPTION OF THE DRAWINGS

Referring to the drawings which form a part of this disclosure:

FIG. 1 is a front elevational view in section of an electrical connector according to the present invention;

FIG. 4 is a front elevational view in section taken along lines 4—4 FIG. 3, but with the contacts and circuit board added;

FIG. 5 is a front elevational view in section taken along lines 5—5 or FIG. 3 with the contacts and circuit board added;

FIG. 6 is a front elevational view in section taken along lines 6—6 of FIG. 2;

DETAILED DESCRIPTION OF THE INVENTION

Figure 2:
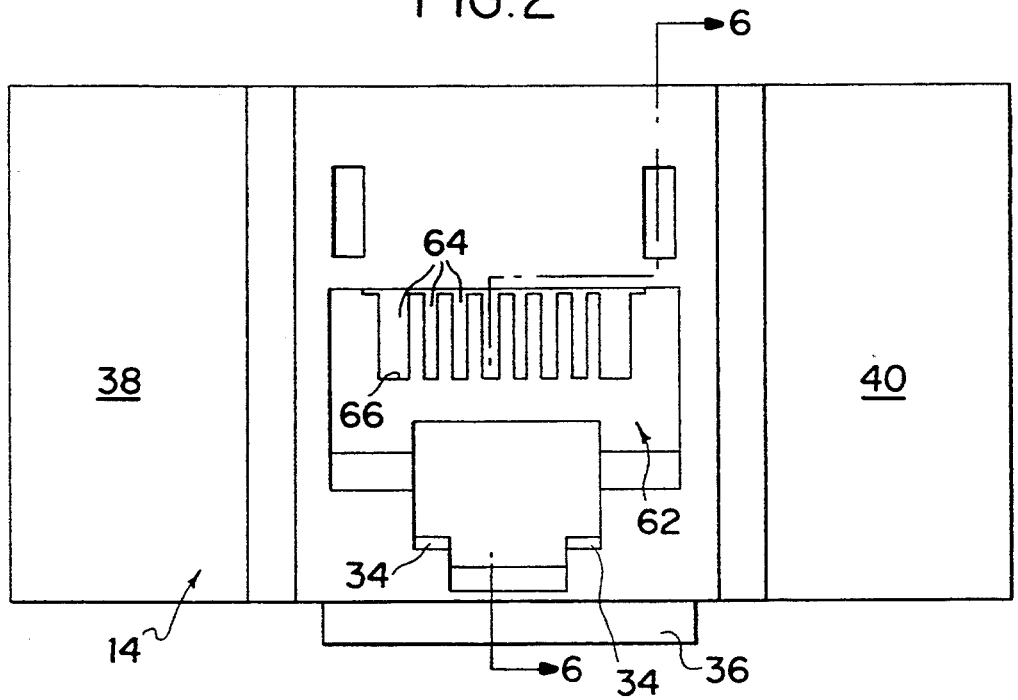
FIG. 2 is a top plan view of the jack housing, without the contacts and circuit board.

Referring initially to FIG. 1, an electrical connector 10 according to the present invention includes a modular jack 12 having a plug receiving or jack housing 14 and a contact support portion 16. A plurality of spring contacts 18 and 19 are housed within plug receiving housing 14. A plurality of contact strips 20 are housed within contacts support portion 16. Spring contacts 18 and 19 are connected to strips 20 by conductive traces on a printed circuit board 22. A stuffer member 24, such as a Siemen's stuffer, is used in combination with contact support portion 16 to connect electrical conductors or wires to contact strips 20.

Contacts support portion 16 and plug receiving housing 14 are molded of dielectric material, preferably plastic, and are coupled together by ultrasonic welding or other methods of bonding to form an integral housing. Contact support portion 16 is formed as disclosed in U.S. Pat. No. 5,061,209 to Bolick, the subject matter of which is in hereby corporated by reference. The plug receiving portion 14 is similar to the plug receiving portion of the jack disclosed in the Bolick patent, as well as U.S. Pat. 4,648,678 to Archer, the subject matter of which is hereby incorporated by reference.

Figure 3:
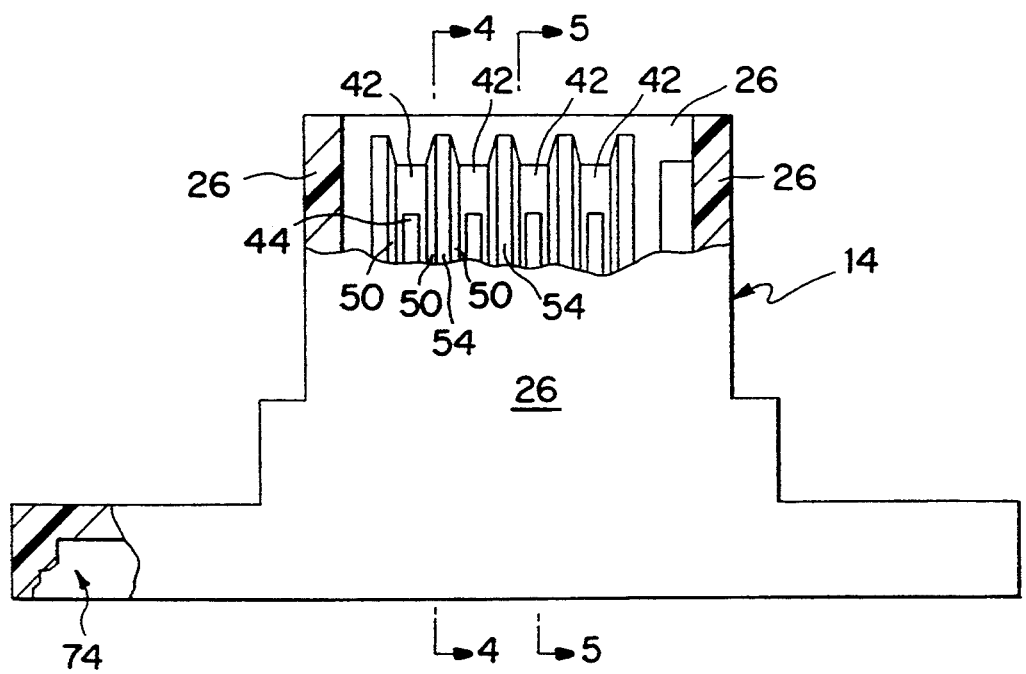
FIG. 3 is a side elevational view, partially in section, of the housing of FIG. 2.

Housing 14 has a plurality of side walls 26 defining a substantially rectangular body with a plug receiving cavity 28. Cavity 28 opens on one side of the housing, and in the illustration of FIG. 1, is closed by a removable dust cover 30. Cavity 28 is shaped to receive an FCC approved electrical connector or plug (not shown). One of the side walls has a recess 32 with a cam 34 facing cavity 28 for engaging a standard FCC modular plug. Recess 32 is configured to receive a portion the FCC modular plug and its latching tab. Cam 34 creates a stationary latch engaging formation which deflects a resilient tab on the modular plug as the plug is inserted into cavity 28, and then retains the plug in cavity 28 by engaging a latching surface on the resilient latch tab of the plug. A fixed latched member 36 protrudes from the exterior surface of one side wall 26 for engaging a support panel. As illustrated in FIGS. 2 and 3, laterally extending flanges 38 and 40 protrude from two opposite side walls 26.

Figure 7:
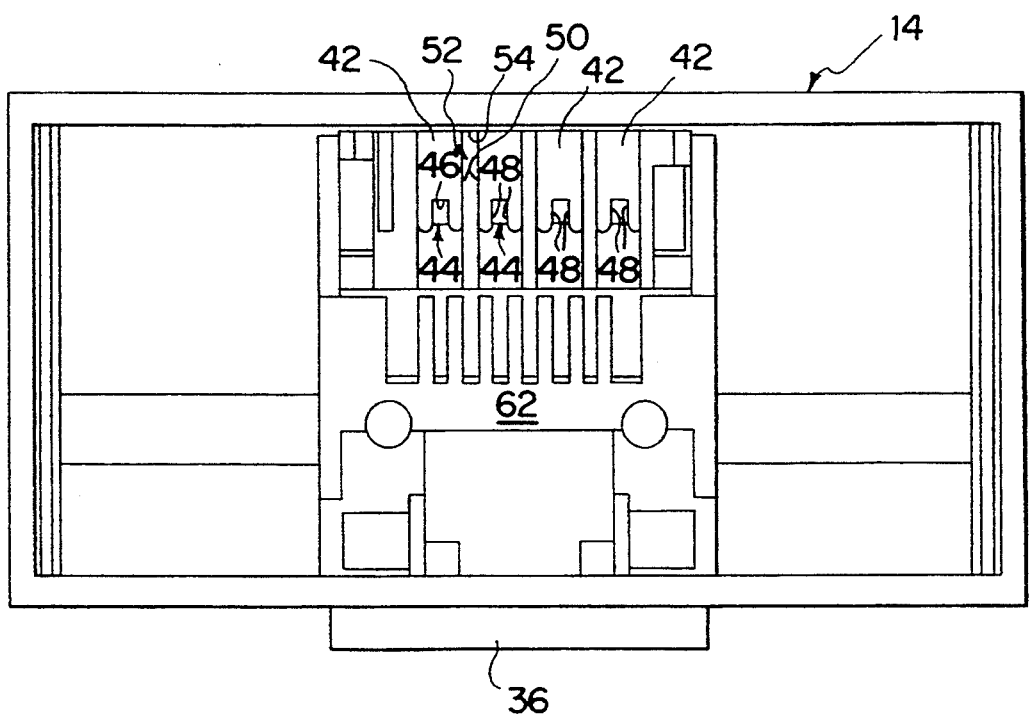
FIG. 7 is a bottom plan view of the housing of FIG. 2.

Referring now to FIGS. 2-7, and particularly to FIGS. 4 and 5, longitudinal projections 42 are unitarily formed as one piece on an inner surface of one of the side walls 26. The projections extend along the height of the inner surface and extend laterally into plug receiving cavity 28. In the illustrated embodiment, four projections 42 are provided (FIG. 3). The distal ends of the projection, i.e., those ends of the projections remote from the inner surface of the side wall from which the projections extend, have open sided grooves 44. Each of the grooves 44 is defined by a base surface 46 and two side surfaces 48 (FIG. 7). Side surfaces 48 extend from opposite side edges of the respective base surface 46 at approximately right angles. The base surfaces of the four grooves 44 are essentially coplanar, i.e., are in a common plane.

Each projection has two outer lateral surfaces 50. The outer lateral surfaces define a second set of four grooves 52. Each groove 52 is defined by one outer surface of each of two adjacent projections 42. Each groove 52 is also defined by a base surface 54 extending between the respective pair of lateral surfaces of adjacent projections 42. The base surfaces 54 are located in a common plane which is parallel to and spaced from the plane containing base surfaces 46 of grooves 44. In this manner, grooves 52 are located adjacent the inner surface of side wall 26, while grooves 44 are spaced from the inner surface of side wall 26 further into plug receiving cavity 28, and grooves 44 and 52 alternate.

Four contacts 18 are engaged, supported and guided in grooves 44, while four contacts 19 are engaged, supported, and guided in grooves 52. Contacts 18 and 19 are similarly, but differently shaped. As best illustrated in FIG. 5, each contact 18 comprises a support leg 56 which is generally straight and received within groove 44 to engage base surface 46. As illustrated in FIG. 5, the upper end of support leg 56 ends in an arcuately bent portion 58 which extends through an arc of approximately 180 degrees. A free end portion 60 extends from the arcuately bent portion 58 and is generally straight. The free end portion extends across plug receiving cavity 28.

A partition wall 62, extending from a side wall 26 opposite that from which projections 42 extend, defines the lower end of plug receiving cavity 28. The partition wall is formed with a plurality of slots 64 aligned with alternating grooves 44 and 52. One end of each slot closest to the grooves is open, while the opposite end of each slot is defined by an abutment surface 66. The lower end of each free end portion 60 is located within a respective slot 64 and engages a respective abutment surface 66. Since contact 18 is made of resilient material it can be placed under stress in the position illustrated in FIG. 5 such that the contact exerts opposite forces on abutment surface 66 and base surface 46.

Referring particularly to FIG. 4, each contact 19 comprises a substantially straight support leg 68 which abuts against base surface 54 in groove 52. The lower end of support leg 68 is engaged with circuit board 22. The upper end of support leg 68 terminates in an arcuately bent portion 70, extending over an arc of approximately 180 degrees. A free end portion 72 extends from arcuately bent portion 70 into and across of plug receiving cavity 28. The lower end of each free end portion 72 extends through a respective slot 64 in partition wall 62 and abuts against a respective abutment surface 66. Like contact 18, contact 19 is formed of resilient metal and is biased against abutment surface 66 and base surface 54.

As indicated by comparison of FIGS. 4 and 5, the radius of curvature of arcurately bent portion 70 is larger than the radius of curvature of arcurately bent portion 58. Additionally, support legs 68 are longer than support legs 56. However, the free end portions 72 and 60 pass through a common plane by abutting the coplanar abutment surfaces 66. In this manner, good contact can be obtained between contacts 18 and 19 and the planar contacts of a standard FCC connection plug.

Projections 42 relatively space adjacent contacts, particularly, the adjacent support legs 56 and 68. The spacing, as well as the additional dielectric material, provided by the projections, tends to reduce the crosstalk across the leg portions, and therefore through the electrical connector 10.

Figure 8:
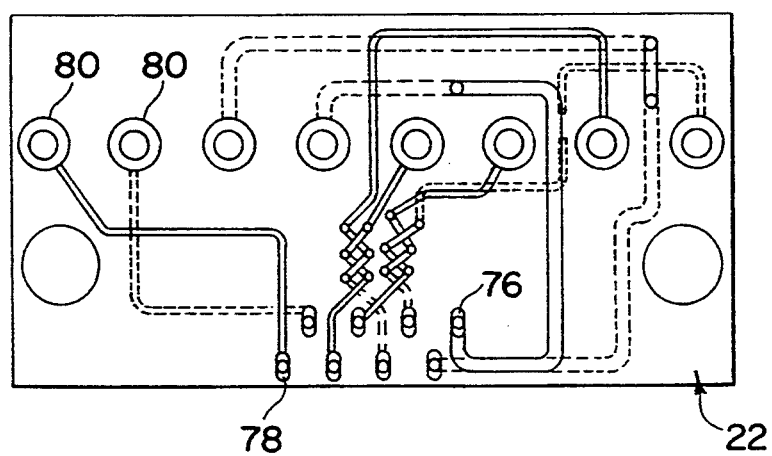
FIG. 8 is a top plan view of the circuit board for the connector of FIG. 1.

Circuit board 22 is retained within a receiving opening 74 in the side of housing 14 remote from the side of the housing in which plug receiving opening 28 opens. As illustrated in FIG. 8, circuit board 22 has first contact points 76 and second contact points 78. First contact points 76 receives the free ends of support legs 56. Contact points 78 receive the free ends of support legs 68. Contact points 76 are aligned with each other. Contact points 78 are also aligned with each other. Contact points 76 are aligned along a line which is parallel to and spaced from the line of contact points 78 in the same manner as support legs 56 and 68 and base surfaces 46 and 54. Additionally, contact points 76 and 78 alternate as illustrated in FIG. 8.

Contact strips 20 are received within and engaged by connection points 80. Contact points 76 and 78 are coupled by conductors printed on the circuit board with connection points 80. The conductors between the contact points 76 and 78 and connection points 80 are suitably formed as disclosed in U.S. patent application Ser. No. 07/932,194 of Klas et al or U.S. patent application Ser. No. 08/002,871 entitled TELECOMMUNICATION CONNECTOR WITH FEEDBACK of William J. Rose et al (concurrently filed herewith) to further reduce the effect of any crosstalk induced within the connector.

While one particular embodiment has been chosen to illustrate the invention, it will be understood by those skilled in the art that various changes and modifications can be made therein without departing from the scope of the invention as defined in the appended claims.

What is claimed is:

1. An electrical connector, comprising:
   a housing of dielectric material having a plurality of side walls and a plug receiving cavity opening on one side of said housing;
   first guide means integrally formed on an inner surface of one of said side walls and projecting into said plug receiving cavity, said first guide means including longitudinal projections extending inwardly from said one side wall into said plug receiving cavity, said projections having distal ends remote from said one side wall with open sided first grooves, each of said first grooves being defined by one base surface and two side surfaces extending from opposite side edges of said base surface;
   second guide means integrally formed on said inner surface of said one of said side walls and projecting into said plug receiving cavity and projecting from said inner surface for a distance less than that of said first guide means, said second guide means including second grooves defined by outer lateral surfaces of said projections and by base surfaces extending between ends of respective pairs of said lateral surfaces, said first and second guide means alternating along said one side wall; and
   first and second contacts received in said first and second guide means, respectively, said contacts having generally straight support legs engaged in said guide means, arcuately bent portions extending from said support legs and free end portions extending from said bent portions into said plug receiving cavity, said support legs of said first and second contacts being located in first and second parallel and spaced planes, respectively, said support legs of said first contacts mating with said base and side surfaces of said first grooves, support legs of said second contacts mating with said lateral surfaces and said base surface of said second grooves.

2. An electrical connector according to claim 1 wherein
   said first and second contacts have different configurations.

3. An electrical connector according to claim 2 wherein
   said bent portions of said second contacts have a greater radius of curvature than said bent portions of said first contacts.

4. An electrical connector according to claim 3 wherein
   said free end portions of said first and second contacts pass through a common plane.

5. An electrical connector according to claim 3 wherein
   said support legs of said second contacts are longer than said support legs of said first contacts.

6. An electrical connector according to claim 1 wherein
   respective pairs of said lateral surfaces taper toward said second groove defined therebetween.

7. An electrical connector according to claim 1 wherein
   a printed circuit board is mounted in said housing, said circuit board having first and second contact points for engaging ends of said support legs remote from said bent portions of said first and second contacts, respectively; and
   said first and second points alternating and being aligned in first and second rows, respectively, said first and second rows being parallel and spaced apart.

8. An electrical connector according to claim 9 wherein
   said printed circuit board is mounted on a side of said housing opposite said one side.

9. An electrical connector, comprising:
   a housing of dielectric material having a plurality of side walls, a plug receiving cavity opening on one side of said housing, and a circuit board receiving opening on an opposite side of said housing;
   longitudinal projections unitarily formed on an inner surface one of said side walls and extending into said plug receiving cavity, said projections having distal ends remote from said inner surface with open sided first grooves, each of said first grooves being defined by one base surface and two side surfaces extending from opposite side edges of said base surface thereof, said base surfaces of said first grooves being in a first plane;
   second grooves defined by outer lateral surfaces of said projections and by base surfaces extending between respective pairs of said lateral surfaces, said base surfaces of said second grooves being in a second plane parallel and spaced from said first plane and located adjacent said inner surface;
   first and second contacts engaged in said first and second grooves, respectively, each of said contacts having a generally straight support leg engaging one of said base surfaces, an arcuately bent portion extending from the respective support leg and a free end portion extending from the respective bent portion and across said plug receiving cavity, said bent portions of said second contacts having a greater radius of curvature than said bent portions of said first contacts, said support legs of said second contacts being longer than said support legs of said first contacts; and a printed circuit board in said circuit board receiving opening, said circuit board having first and second contact points for receiving ends of said support legs remote from said bent portions of said first and second contacts, respectively, said first and second points alternating and being aligned with said first and second grooves, respectively.

10. An electrical connector according to claim 9 wherein respective pairs of said lateral surfaces taper toward said second groove defined therebetween.

11. An electrical connector, comprising:

a housing of dielectric material having a plurality of side walls and a plug receiving cavity opening on one side of said housing;

first guide means integrally formed on an inner surface of one of said side walls and projecting into said plug receiving cavity, said first guide means including longitudinal projections extending inwardly from said one side wall into said plug receiving cavity, said projections having distal ends remote from said one side wall with open sided first grooves, each of said first grooves being defined by one base surface and two side surfaces extending from opposite side edges of said base surface;

second guide means integrally formed on said inner surface of said one of said side walls and projecting into said plug receiving cavity and projecting from said inner surface for a distance less than that of said first guide means, said second guide means including second grooves defined by outer lateral surfaces of said projections and by base surfaces extending between ends of respective pairs of said lateral surfaces, said first and second guide means alternating along said one side wall; and first and second contacts received in said first and second guide means, respectively, said contacts having support legs engaged in said guide means, bent portions extending from said support legs and free end portions extending from said bent portions into said plug receiving cavity, said support legs of said first contacts mating with said base and side surfaces of said first grooves, said support legs of said second contacts mating with said lateral surfaces and said base surface of said second grooves.

12. An electrical connector according to claim 11 wherein said support legs of said contacts are generally straight.

13. An electrical connector according to claim 11 wherein said bent portions of said contacts are arcuate.

14. An electrical connector according to claim 11 wherein said support legs are located in first and second parallel and spaced planes, respectively.

15. An electrical connector according to claim 11 wherein said first and second contacts have different configurations.

16. An electrical connector according to claim 13 wherein said bent portions of said second contacts have a greater radius of curvature than said bent portions of said first contacts.

17. An electrical connector, comprising:

a housing of dielectric material having a plurality of side walls and a plug receiving cavity opening on one side of said housing;

first guide means projecting into said plug receiving cavity relative to an inner surface of one of said side walls;

second guide means projecting into said plug receiving cavity and located at a distance from said inner surface less than that of said first guide means, said first and second guide means alternating along a length of said one side wall; and first and second contacts received in said first and second guide means, respectively, said contacts having generally straight support legs engaged in said guide means, arcuately bent portions extending from said support legs and free end portions extending from said bent portions into said plug receiving cavity, said support legs of said first and second contacts being located in first and second parallel and spaced planes, respectively, said support legs of said second contacts being longer than said support legs of said first contacts such that said bent portions of said second contacts are spaced from said bent portions of said first contacts in directions parallel to lengths of said support legs.

18. An electrical connector according to claim 17 wherein said bent portions of said second contacts have a greater radius of curvature than said bent portions of said first contacts.

19. An electrical connector according to claim 18 wherein said free end portions of said first and second contacts extend in a common plane.

20. An electrical connector according to claim 17 wherein said first guide means comprise longitudinal projections extending inwardly from said one side wall into said plug receiving cavity, said projections having distal ends remote from said one side wall with open sided first grooves, each of said first grooves being defined by one base surface and two side surfaces extending from opposite side edges of said base surface;

said support legs of said first contacts mate with said base and side surfaces of said first grooves;

said second guide means comprise second grooves defined by outer lateral surfaces of said projections and by base surfaces extending between ends of respective pairs of said lateral surfaces; and said support legs of said second contacts mate with said lateral surfaces and said base surface of said second grooves.

21. An electrical connector according to claim 17 wherein a printed circuit board is mounted in said housing, said circuit board having first and second contact points for engaging ends of said support legs remote from said bent portions of said first and second contacts, respectively; and said first and second points alternating and being aligned in first and second rows, respectively, said first and second rows being parallel and spaced apart.

22. An electrical connector according to claim 21 wherein said printed circuit board is mounted on a side of said housing opposite said one side.

23. An electrical connector, comprising:
- a housing of dielectric material having a plurality of side walls and a plug receiving cavity opening on one side of said housing;
- first guide means projecting into said plug receiving cavity relative to an inner surface of one of said side walls;
- second guide means projecting into said plug receiving cavity, said first and second guide means alternating along a length of said one side wall; and
- first and second contacts received in said first and second guide means, respectively, said contacts having generally straight support legs engaged in said guide means, arcuately bent portions extending from said support legs and free end portions extending from said bent portions into said plug receiving cavity and terminating generally in the same plane, said support legs of said second contacts being longer than said support legs of said first contacts such that said bent portions of said second contacts are spaced from said bent portions of said first contacts in directions parallel to lengths of said support legs.

24. An electrical connector according to claim 23 wherein
said bent portions of said second contacts have a greater radius of curvature than said bent portions of said first contacts.

25. An electrical connector according to claim 24 wherein
said free end portions of said first and second contacts extend in a common plane.

* * * * *